(12) United States Patent
Steigerwald et al.

(10) Patent No.: US 11,776,959 B2
(45) Date of Patent: Oct. 3, 2023

(54) WRAP-AROUND TRENCH CONTACT STRUCTURE AND METHODS OF FABRICATION

(71) Applicant: Intel Corporation, Santa Clara, CA (US)

(72) Inventors: Joseph Steigerwald, Forest Grove, OR (US); Tahir Ghani, Portland, OR (US); Oleg Golonzka, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 76 days.

(21) Appl. No.: 17/082,434

(22) Filed: Oct. 28, 2020

(65) Prior Publication Data

US 2021/0043627 A1 Feb. 11, 2021

Related U.S. Application Data

(63) Continuation of application No. 15/828,259, filed on Nov. 30, 2017, now Pat. No. 10,861,851, which is a (Continued)

(51) Int. Cl.
*H01L 27/092* (2006.01)
*H01L 29/417* (2006.01)
(Continued)

(52) U.S. Cl.
CPC .... *H01L 27/0924* (2013.01); *H01L 21/76897* (2013.01); *H01L 23/485* (2013.01);
(Continued)

(58) Field of Classification Search
None
See application file for complete search history.

(56) References Cited

U.S. PATENT DOCUMENTS 6,857,478 B1  2/2005  Weber
6,969,656 B2  11/2005  Du et al.
(Continued)

FOREIGN PATENT DOCUMENTS

CN   101189730   5/2008
CN   102130008   7/2011
(Continued)

OTHER PUBLICATIONS

J. M. Hughes, "Arduino: A Technical Reference: Chapter 1: The Arduino Family", May 2016 (Year: 2016).*
(Continued)

*Primary Examiner* — Vincent Wall
(74) *Attorney, Agent, or Firm* — Schwabe, Williamson & Wyatt, P.C.

(57) ABSTRACT

A wrap-around source/drain trench contact structure is described. A plurality of semiconductor fins extend from a semiconductor substrate. A channel region is disposed in each fin between a pair of source/drain regions. An epitaxial semiconductor layer covers the top surface and sidewall surfaces of each fin over the source/drain regions, defining high aspect ratio gaps between adjacent fins. A pair of source/drain trench contacts are electrically coupled to the epitaxial semiconductor layers. The source/drain trench contacts comprise a conformal metal layer and a fill metal. The conformal metal layer conforms to the epitaxial semiconductor layers. The fill metal comprises a plug and a barrier layer, wherein the plug fills a contact trench formed above the fins and the conformal metal layer, and the barrier layer lines the plug to prevent interdiffusion of the conformal metal layer material and plug material.

20 Claims, 10 Drawing Sheets

Related U.S. Application Data continuation of application No. 13/996,523, filed as application No. PCT/US2011/068218 on Dec. 30, 2011, now Pat. No. 9,876,016.

(51) Int. Cl.
| | |
|---|---|
| *H01L 27/088* | (2006.01) |
| *H01L 29/66* | (2006.01) |
| *H01L 21/768* | (2006.01) |
| *H01L 23/485* | (2006.01) |
| *H01L 29/78* | (2006.01) |

(52) U.S. Cl.
CPC .... *H01L 27/0886* (2013.01); *H01L 29/41766* (2013.01); *H01L 29/41791* (2013.01); *H01L 29/66795* (2013.01); *H01L 29/785* (2013.01); H01L 2029/7858 (2013.01); H01L 2924/0002 (2013.01)

(56) References Cited

U.S. PATENT DOCUMENTS

| | | | | |
|---|---|---|---|---|
| 7,074,662 | B2* | 7/2006 | Lee | H01L 29/7851 438/296 |
| 7,179,713 | B2* | 2/2007 | Lee | H01L 29/42384 438/283 |
| 7,190,050 | B2 | 3/2007 | King et al. | |
| 7,279,375 | B2 | 10/2007 | Radosavljevic | |
| 7,456,471 | B2* | 11/2008 | Anderson | H01L 29/41791 257/E29.147 |
| 7,692,254 | B2 | 4/2010 | Anderson | |
| 8,362,574 | B2* | 1/2013 | Kawasaki | H01L 29/7853 257/E27.059 |
| 8,415,751 | B2 | 4/2013 | Mukherjee et al. | |
| 8,507,996 | B2 | 8/2013 | Sun | |
| 10,319,841 | B2* | 6/2019 | Cho | H01L 27/10 |
| 2003/0102518 | A1* | 6/2003 | Fried | H01L 21/84 257/350 |
| 2003/0183936 | A1* | 10/2003 | Ito | H10B 53/30 257/E21.011 |
| 2004/0036127 | A1 | 2/2004 | Chau et al. | |
| 2004/0142524 | A1 | 7/2004 | Grupp et al. | |
| 2005/0218438 | A1 | 10/2005 | Lindert et al. | |
| 2005/0224800 | A1* | 10/2005 | Lindert | H01L 29/7851 257/66 |
| 2005/0245009 | A1* | 11/2005 | Bryant | H01L 29/42368 438/151 |
| 2007/0001219 | A1* | 1/2007 | Radosavljevic | H01L 29/785 257/327 |
| 2008/0283925 | A1 | 11/2008 | Berthold | |
| 2009/0020819 | A1 | 1/2009 | Anderson | |
| 2010/0035400 | A1 | 2/2010 | Zhu | |
| 2010/0059807 | A1 | 3/2010 | Cho et al. | |
| 2010/0155845 | A1 | 6/2010 | Toba et al. | |
| 2010/0155846 | A1 | 6/2010 | Mukherjee | |
| 2010/0176438 | A1 | 7/2010 | Lue et al. | |
| 2011/0095372 | A1 | 4/2011 | Yuan | |
| 2011/0133259 | A1 | 6/2011 | Fischer et al. | |
| 2011/0147840 | A1* | 6/2011 | Cea | H01L 29/66795 257/350 |
| 2011/0175165 | A1 | 7/2011 | Yu et al. | |
| 2011/0260282 | A1 | 10/2011 | Kawasaki | |
| 2011/0272765 | A1* | 11/2011 | Seo | H01L 29/7833 257/E21.409 |
| 2011/0278676 | A1 | 11/2011 | Cheng et al. | |
| 2013/0026571 | A1 | 1/2013 | Kawa | |
| 2014/0001520 | A1 | 1/2014 | Glass et al. | |
| 2014/0065782 | A1* | 3/2014 | Lu | H01L 29/41791 257/E21.409 |
| 2014/0183632 | A1* | 7/2014 | Tseng | H01L 29/785 438/158 |
| 2014/0273397 | A1* | 9/2014 | Rodder | H01L 29/41791 438/400 |
| 2015/0311343 | A1* | 10/2015 | Chowdhury | H01L 21/324 438/283 |

FOREIGN PATENT DOCUMENTS

| | | |
|---|---|---|
| CN | 102157555 | 8/2011 |
| KR | 10-2006-0130704 | 12/2006 |
| KR | 10-2011-0084155 | 7/2011 |
| KR | 10-2011-0084166 | 7/2011 |
| WO | WO 2005098963 | 10/2005 |
| WO | WO 2010080276 | 7/2010 |

OTHER PUBLICATIONS

Wikipedia, https://en.wikipedia.org/wiki/Back_end_of_line#/media/File:Cmos-chip_structure_in_2000s_(en).svg, Dec. 6, 2006 (Year: 2006).*
Office Action from the Chinese Patent Office dated May 3, 2016 for Chinese Patent Application No. 201180076472.X, 8 pages.
Second Office Action from the State Intellectual Property Office (SIPO) dated Jan. 19, 2017 and English Translation thereof for Chinese Patent Application No. 201180076472.X, 10 pages.
Notification of Granting a Patent Right (4 pages) from the State Intellectual Property Office (SIPO) dated May 2, 2017 for Chinese Patent Application No. 201180076472.X and English Translation thereof.
Notice of Preliminary Rejection (Non-Final) from Korean Intellectual Property Office (KIPO) dated Jul. 29, 2015 for Korean Patent Application No. 10-2014-7017850 and English Summary thereof.
Notice of Preliminary Rejection (Non-Final) from Korean Intellectual Property Office (KIPO) dated Feb. 16, 2016 for Korean Patent Application No. 10-2014-7017850 and English Summary thereof.
Notice of Allowance from the Korean Intellectual Property Office (KIPO) dated Aug. 3, 2016 for Korean Patent Application No. 10-2014-7017850 2 pages.
Notice of Preliminary Rejection (Non-Final) from the Korean Intellectual Property Office (KIPO) dated Jan. 18, 2017 for Korean Patent Application No. 10-2016-7030997 and English Summary thereof, 5 pages.
Notice of Allowance for Korean Patent Application No. 10-2016-7030997 dated Jul. 25, 2017, 2 pgs.
Office Action from Korean Patent Application 10-2017-7030778, dated Dec. 27, 2017, 5 pages (including English language summary).
Office Action for Korean Patent Application No. 10-2017-7030778, dated May 17, 2018, 6 pages.
Office Action for Korean Patent Application No. 10-2018-7017196, dated Jul. 25, 2018, 3 pages.
Office Action for Korean Patent Application No. 10-2018-7017196 dated Aug. 8, 2019, 5 pages.
International Search Report and Written Opinion dated Aug. 1, 2012 for PCT/US2011/068218, filed Dec. 30, 2011, 8 pages.
International Preliminary Report dated Jul. 10, 2014 for PCT/US2011/068218, filed Dec. 30, 2011, 7 pages.
Office Action for Taiwan Patent Application No. 101149050 dated Oct. 14, 2014.
Summary of First Office Action for Taiwan Patent Application No. 101149050 dated Jun. 30, 2015.
Notice of Allowance for Taiwan Patent Application No. 101149050, dated Jun. 14, 2016, 3 pages.
Chiacarella et al., "Benchmarking SOI and bulk FinFET alternatives for PLANAR 10 CMOS scaling succession", Solid-State Electronics 54 (2010) 855-861.
Office Action from Chinese Patent Application No. 201710003272.0, dated Oct. 23, 2019, 9 pgs.
Office Action from Korean Patent Application No. 10-2017-7030778, dated Jul. 8, 2019, 24 pgs.
Notice of Allowance from Chinese Patent Application No. 201710003272.0, dated Apr. 3, 2020, 4 pgs.
Office Action from Chinese Patent Application No. 201710513083.8, dated Mar. 2, 2020, 5 pgs.
Datta et al., "Impact of Contact and Local Interconnect Scaling on Logic Performance", 2014 Symposium on VLSI Technology Digest of Technical Papers, pp. 1-2 (Year: 2014).

(56) References Cited

OTHER PUBLICATIONS

Poon et al., "Resistivity and thermal stability of nickel monosilicide", Applied Surface Science 157 (2000) 29-35.
Resistivity and temperature coefficient at 20 C, http://hyperphysics.phy-astr.gsu.edu/hbase/Tables/rstiv.html.
English translation of KR 10-2017-7030779.
Notice of Allowance from Chinese Patent Application No. 201710513083.8, dated Sep. 2, 2020, 8 pgs., with English Translation.

* cited by examiner

WRAP-AROUND TRENCH CONTACT STRUCTURE AND METHODS OF FABRICATION

CROSS-REFERENCE TO RELATED APPLICATIONS

This patent application is a continuation of U.S. patent application Ser. No. 15/828,259, filed Nov. 30, 2017, now U.S. Pat. No. 10,861,851, issued Dec. 8, 2020, which is a continuation of U.S. patent application Ser. No. 13/996,523, filed Jun. 20, 2013, now U.S. Pat. No. 9,876,016, issued Jan. 23, 2018, which is a U.S. National Phase Application under 35 U.S.C. § 371 of International Application No. PCT/US2011/068218, filed Dec. 30, 2011, the entire contents of which are hereby incorporated by reference herein.

TECHNICAL FIELD

The present invention relates generally to the manufacture of semiconductor devices. In particular, embodiments of the present invention relate to fin-based transistor devices with wrap-around source/drain contacts that improve device performance.

BACKGROUND

The limits of planar transistors have constrained efforts to increase integrated circuit performance while decreasing the size of devices. Recently developed fin-based transistors enable denser packing of device components and greater current control with the use of wrap-around dual- and tri-gates. Use of multiple fins enables further tailoring of device specifications and increased performance. However, source/drain contacts for multi-fin devices are typically formed over the top edges of the fins, which can lead to high resistance due to current crowding at the fin tips.

DETAILED DESCRIPTION

Figure 1A:
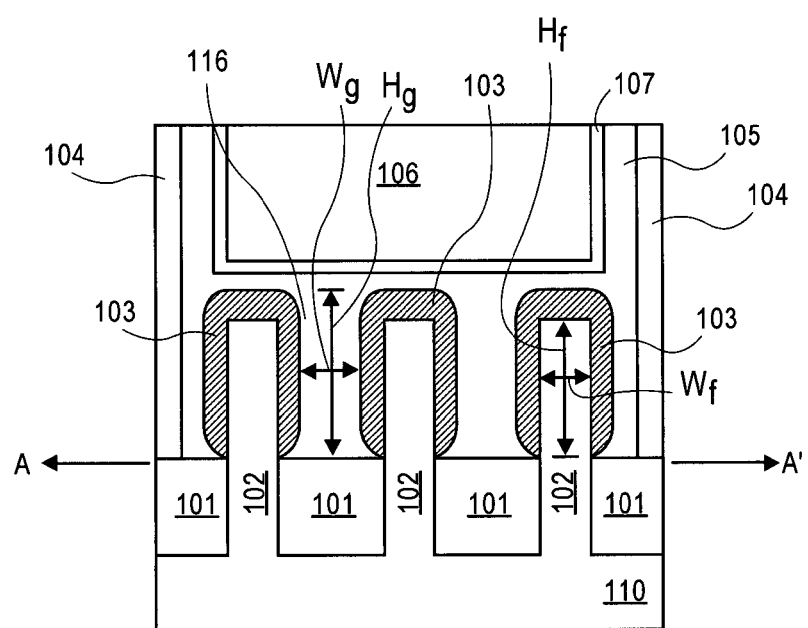
FIG. 1A illustrates a cross-sectional view of a semiconductor device with wrap-around contacts, according to an embodiment of the invention.

A wrap-around source/drain trench contact structure for use with a multi-fin transistor and methods for forming such wrap-around trench contacts are described. The present invention has been described with respect to specific details in order to provide a thorough understanding of the invention. One of ordinary skill in the art will appreciate that the invention can be practiced without these specific details. In other instances, well known semiconductor processes and equipment have not been described in specific detail in order to not unnecessarily obscure the present invention. Additionally, the various embodiments shown in the figures are illustrative representations and are not necessarily drawn to scale.

Wrap-around source/drain trench contacts for a multi-fin MOSFET device and methods for forming such wrap-around trench contacts are disclosed herein. The fin-based transistor structure comprises a plurality of semiconductor fins, each having a top surface and side surfaces. The fins have a high aspect ratio in the direction normal to the substrate surface, in order to increase the surface area available for device formation while maintaining a small device footprint. The high aspect ratio fins are closely spaced, creating high aspect ratio gaps between each adjacent fin. A gate stack structure wraps around the top and side surfaces of a portion of each fin defining a channel region therein. Each fin has a pair of source/drain regions on opposite sides of the channel region. An epitaxially grown semiconductor layer covers the top and side surfaces of each fin in the source/drain regions. The epitaxial semiconductor layer increases the surface area available to form source/drain contacts and narrows the gap between the fins. The gate stack structure is insulated from the epitaxial portion of the source/drain regions by gate sidewall spacers.

A source/drain trench contact structure wraps around each source/drain region by conforming to the surfaces of the epitaxial semiconductor layers, establishing contact from the top to the base of the fin. The source/drain trench contact structure comprises a contact metal layer and a fill metal. The contact metal layer is a conformal, uniformly thick layer that establishes a high surface area, low barrier height interface with the epitaxial semiconductor layers. In an embodiment, the contact metal layer completely fills each high aspect ratio gap between the fins. The contact metal layer material is selected to have a work function that minimizes the barrier height at the metal-semiconductor interface. The fill metal fills the contact trench above the contact metal layer and the fins. In an embodiment, the fill material fills a portion of the high aspect ratio gap. The fill metal comprises a conductive metal plug that is lined by a barrier layer. The barrier layer may prevent interdiffusion of the plug material and the contact metal layer material, improve adhesion of the plug and contact, and/or prevent chemical attack of the contact metal during deposition of the plug material.

While current crowding occurs in conventional multi-fin source/drain contacts that contact primarily the fin tips, the disclosed wrap-around contacts conform to the top and side surfaces of the source/drain regions of each fin, enabling a greater contact surface area and reduced current crowding without increasing fin pitch. In addition, resistance at the interface of the source/drain region of the fin with the metal contact is reduced by selecting materials to achieve a suitable metal-semiconductor barrier height. These aspects of the invention enable further control of contact resistance and drive current to improve device performance as device dimensions continue to shrink.

Figure 1B:
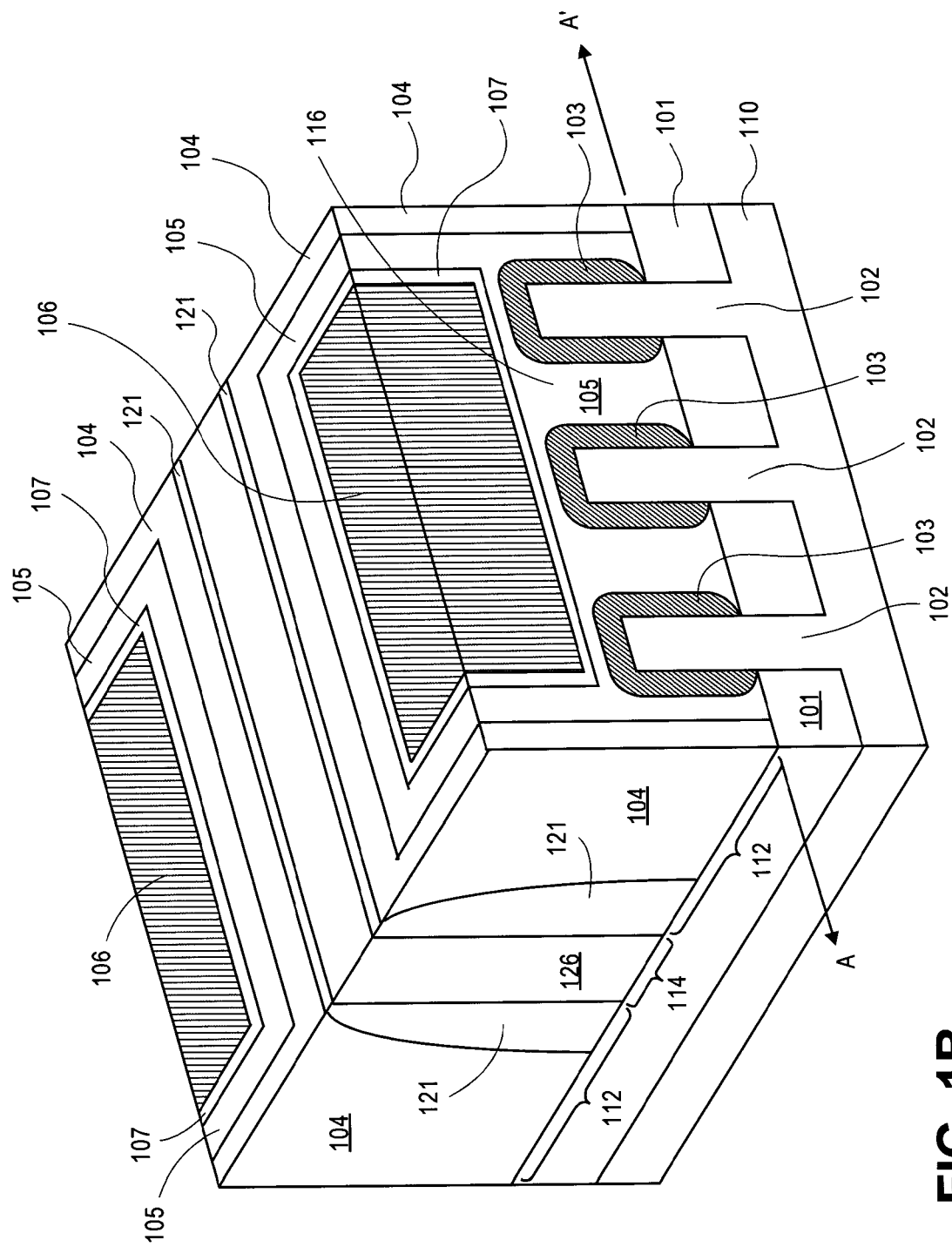
FIG. 1B illustrates a three-dimensional perspective of a semiconductor device with wrap-around contacts, according to an embodiment of the invention.

FIGS. 1A-B illustrate multiple views of a multi-fin transistor having wrap-around source/drain trench contacts. FIG. 1A illustrates a cross-sectional view through the source/drain regions of the device, taken along line A-A' in FIG. 1B. FIG. 1B is a three-dimensional perspective showing the gate portion of a multi-fin transistor and the opposing source/drain regions.

According to an embodiment of the invention, a multi-fin transistor is illustrated in FIGS. 1A-B. Fins 102 extend from semiconductor substrate 110. As an example, a three-fin device is shown for illustrative purposes, but it is to be understood that alternative embodiments may include more or fewer fins. Isolation regions 101 separate the base of each fin 102, in order to reduce current leakage from the base of the fin. Fins 102 have a high aspect ratio, which enables a wider effective gate width for a small device footprint. The fin aspect ratio is defined as the ratio of fin height Hf to fin width Wf. The fin height Hf, as shown in FIG. 1A, is the height of the fin extending above the isolation region 101 in the direction normal to the surface of substrate 110. The fin width Wf is the fin dimension perpendicular to the fin height and parallel to the cross-sectional plane of the source/drain region shown in FIG. 1A. Fins 102 may have a height of 10-100 nm and a width of 5-20 nm and may have an aspect ratio greater than 4. In an embodiment, fins 102 have a height of 50 nm and a width of 10 nm.

Gate structure 126 wraps around the side and top surfaces of a portion of the fin, defining a channel region 114 disposed in the fin. Gate structure 126 may comprise a gate dielectric and gate electrode. The gate dielectric isolates the gate electrode from the fin. Gate dielectric materials are well known in the semiconductor art, for example, a high k material, such as hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. The gate dielectric may also comprise a native oxide on the fin surface. The gate electrode may be composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode is composed of a non-workfunction setting fill material formed above a work-function setting material.

A pair of source/drain regions 112 are disposed on opposite sides of the channel region 114. In an embodiment, each source/drain region 112 comprises a portion of the fin and an epitaxial semiconductor layer 103 grown on the fin surface. Epitaxial semiconductor layer 103 is grown on the top and sidewall surfaces of fins 102 in the source/drain regions 112 to increase surface area available for forming source/drain contacts. In addition, epitaxial semiconductor layer 103 may improve the metal-semiconductor interface between the fins and the source/drain trench contacts by correcting for damage to the fins caused by prior etching processes. In an embodiment, the growth of epitaxial semiconductor layer 103 directly from the fin surface results in a conformal or nearly conformal layer of material. In an embodiment, epitaxial semiconductor layer 103 has a uniform thickness. Epitaxial semiconductor layer 103 may be up to 20 nm thick. In an embodiment, epitaxial semiconductor layer 103 is 5 nm thick.

The source/drain regions 112 may be doped or undoped. In a specific embodiment, the source/drain regions are p-type doped to form a PMOS device. In another specific embodiment, the source/drain regions are n-type doped to form an NMOS device. The channel region 114 may be doped opposite of the source/drain regions. In addition, epitaxial semiconductor layer 103 is insulated from the sidewalls of gate structure 126 by sidewall spacers 121. In an embodiment, sidewall spacers 121 are composed of an insulative dielectric material such as, but not limited to, silicon dioxide, silicon oxy-nitride, or silicon nitride.

Fins are closely spaced in order to maintain a small device footprint. Fins 102 may be spaced from 25-70 nm apart. In a specific embodiment, fins 102 are spaced 50 nm apart. Fins 102, together with the epitaxial semiconductor layers 103 formed thereon, define a high aspect-ratio gap 116 between adjacent fins 102. The gap aspect ratio is defined as the ratio of the height Hg of gap 116—from the isolation region 101 surface to the top of the epitaxial silicon layer 103—to the width Wg of gap 116, as shown in FIG. 1A. Gaps 116 may have a height from 10 to 120 nm and a width from 15 to 50 nm. In an embodiment, gaps 116 have a height of 60 nm and a width of 20 nm. In an embodiment of the invention, gap 116 has an aspect ratio equal to 3.

Fins 102 extend from substrate 110. In an embodiment, each fin 102 is continuous and runs the full length of substrate 110. Substrate 110 and fins 102 are composed of any material suitable for semiconductor device fabrication. In one embodiment, the multi-fin structure is formed directly from a bulk substrate, such as a monocrystalline silicon substrate. In other embodiments, the bulk substrate comprises germanium, silicon-germanium or a group III-V compound semiconductor material. Additionally, substrate 110 may include a buffer layer used to grade the lattice constant from a lower substrate to the material desired for the fins formed thereon. Alternatively, the structure 100 may be fabricated from a semiconductor-on-insulator (SOI) substrate. An SOI substrate includes a lower bulk substrate, a middle insulator layer and a top monocrystalline layer. In an embodiment, the SOI substrate is formed by wafer transfer. In an embodiment, fins 102 are formed from the top monocrystalline layer of an SOI substrate.

In an embodiment of the invention, a pair of source/drain trench contacts wrap around source/drain regions 112, conforming to the epitaxial semiconductor layers 103 and filling high-aspect ratio gaps 116. In an embodiment, no epitaxial semiconductor layer has been grown, and source/drain trench contacts are formed directly on the surface of fins 102. In an embodiment, the source/drain trench contacts comprise a conformal contact metal layer 105 and a fill metal. In the embodiment shown in FIGS. 1A-B, the fill metal comprises plug 106 and barrier layer 107. In an embodiment, contact metal layer 105 conforms to the surfaces defining the contact trench, such as epitaxial semiconductor layers 103, dielectric layer 104, sidewall spacer 121, and isolation regions 101, as shown in FIGS. 1A-B. In an embodiment where there is no epitaxial semiconductor layer 103 on fins 102, source/drain trench contacts are formed directly on the surface of fins 102. In an embodiment, contact metal layer 105 completely or nearly completely fills the high aspect ratio gaps between adjacent epitaxial silicon layers 103, establishing a low-conductivity path to the base of each fin 102. In an embodiment, there is no fill metal material within gaps 116, as shown in FIG. 1A. In another embodiment, fill metal extends into gaps 116. In an embodiment, there are no voids at the metal-semiconductor interface. The large contact surface area reduces resistance caused by current crowding, thereby improving device performance without increasing the device footprint. In an embodiment, contact metal layer 105 is formed to a thickness sufficient to fill gaps 116 and uniformly cover source/drain regions 112. The thickness of contact metal layer 105 may range from 1 to 10 nm. In an embodiment of the invention, contact metal layer 105 is 5 nm thick.

Contact metal layer 105 is a highly conductive material that minimizes the barrier height between epitaxial semiconductor layer 103 and contact metal layer 105, further reducing resistance in the contacts. In an embodiment of the invention, no silicide forms at metal-semiconductor interface between contact metal layer 105 and epitaxial semiconductor layer 103. In an embodiment, contact metal layer 105 comprises a material having a high conductivity of, for example, from 1.6-200 μΩ-cm in order to prevent loss of transistor drive current. In an embodiment the transistor is a NMOS transistor, where the contact metal layer 105 has an n-type work function. In a specific embodiment, the NMOS transistor has n-type doped source/drain regions and a p-type doped channel region. Use of an n-type work function metal for source/drain contacts on an n-type source/drain region minimizes barrier height at the metal-semiconductor interface. The n-type contact metal layer 105 may have a work function that is between 3.9 eV and 4.2 eV. Metals that may be used for the n-type contact metal layer 105 include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. A PMOS device may be made with either a p-type or n-type work function contact metal layer 105. A p-type contact metal layer 105 may have a work function that is between 5.1 eV and 5.4 eV. In a specific embodiment, the PMOS transistor has p-type source/drain regions and an n-type channel region. Contact metal layer 105 may include any of the n-type work function metals listed above, or a p-type work function metal, such as ruthenium, palladium, platinum, cobalt, nickel, conductive metal oxides such as ruthenium oxide, or conductive metal nitrides such as titanium nitride. In a specific embodiment, an integrated circuit comprises both an n-type transistor and a p-type transistor, wherein the n-type transistor has a source/drain contact comprising a contact metal with an n-type work function, and wherein the p-type transistor has a source/drain contact comprising a contact metal with a p-type work function.

In an embodiment, the fill metal formed on top of contact metal layer 105 comprises plug 106 and barrier layer 107. Plug 106 is formed above contact metal layer 105 to establish electrical contact with the source/drain region 112. In an embodiment, plug 106 has a lower resistivity than contact metal layer 105. In an embodiment, plug 106 comprises tungsten, aluminum, copper, or a combination of these. Barrier layer 107 lines plug 106 to prevent interdiffusion of contact metal layer 105 and plug 106, which could alter the work function of contact metal layer 105 and potentially increase resistance at the metal-semiconductor interface. Barrier layer 107 may be any material and thickness suitable for preventing interdiffusion without unduly interfering with the conductivity of the source/drain contact. In an embodiment, barrier layer 107 comprises titanium, titanium nitride, tantalum, tantalum nitride, hafnium, or lanthanum. Barrier layer 107 may be 1 to 5 nm thick. In an embodiment, barrier layer 107 is 2 nm thick.

Interlayer dielectric (ILD) 104 provides both intralayer insulation between the illustrated structure and neighboring components and also interlayer insulation between the layer containing the illustrated structure and any additional upper or lower device layers. Interlayer dielectric 104 may be any suitable low k material, such as, but not limited to, silicon dioxide, silicon nitride or silicon oxynitride.

Figure 2A:
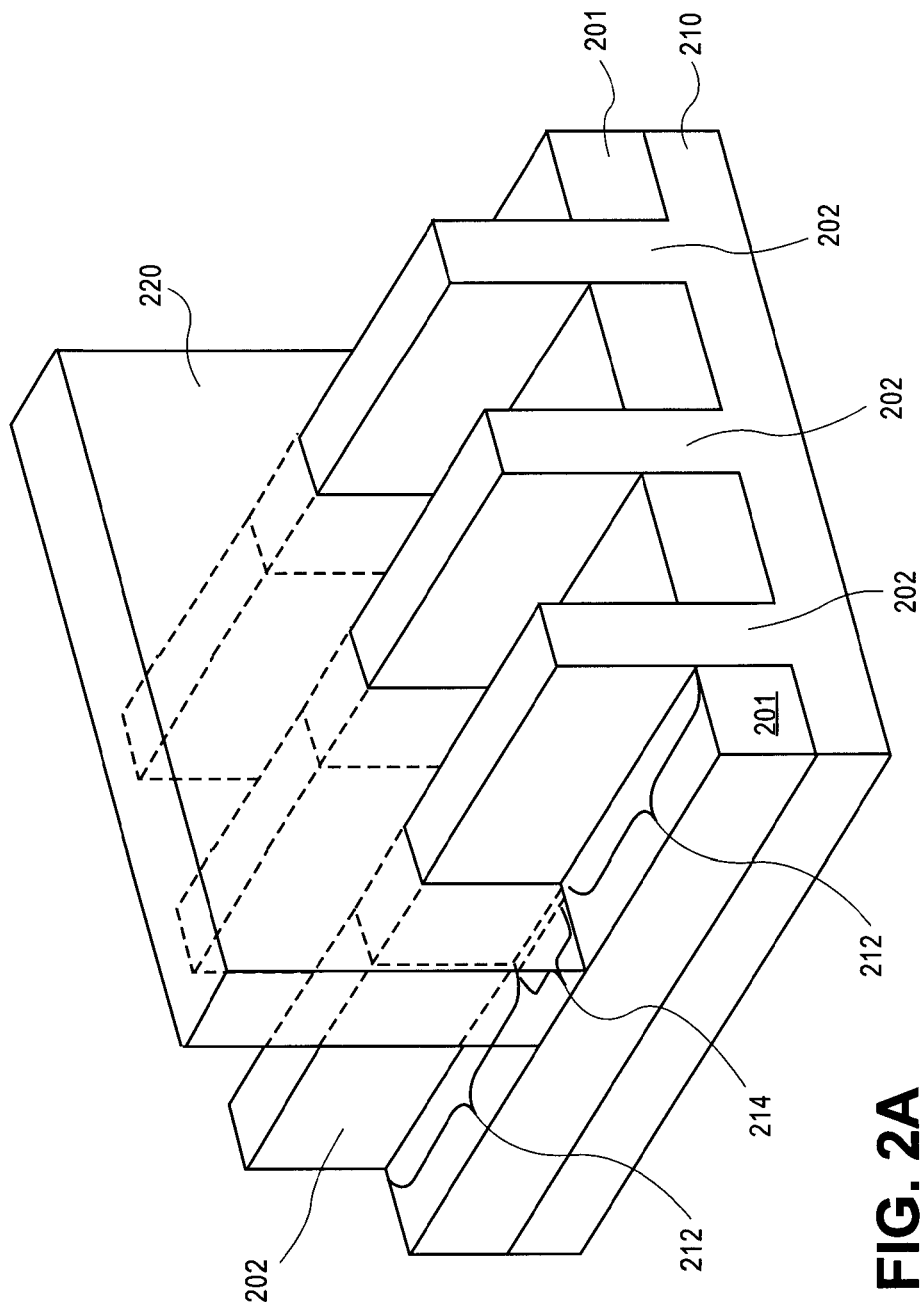
FIGS. 2A-2E illustrate a three-dimensional perspective of a process for forming a multi-fin semiconductor device, according to an embodiment of the invention.
Figure 2B:
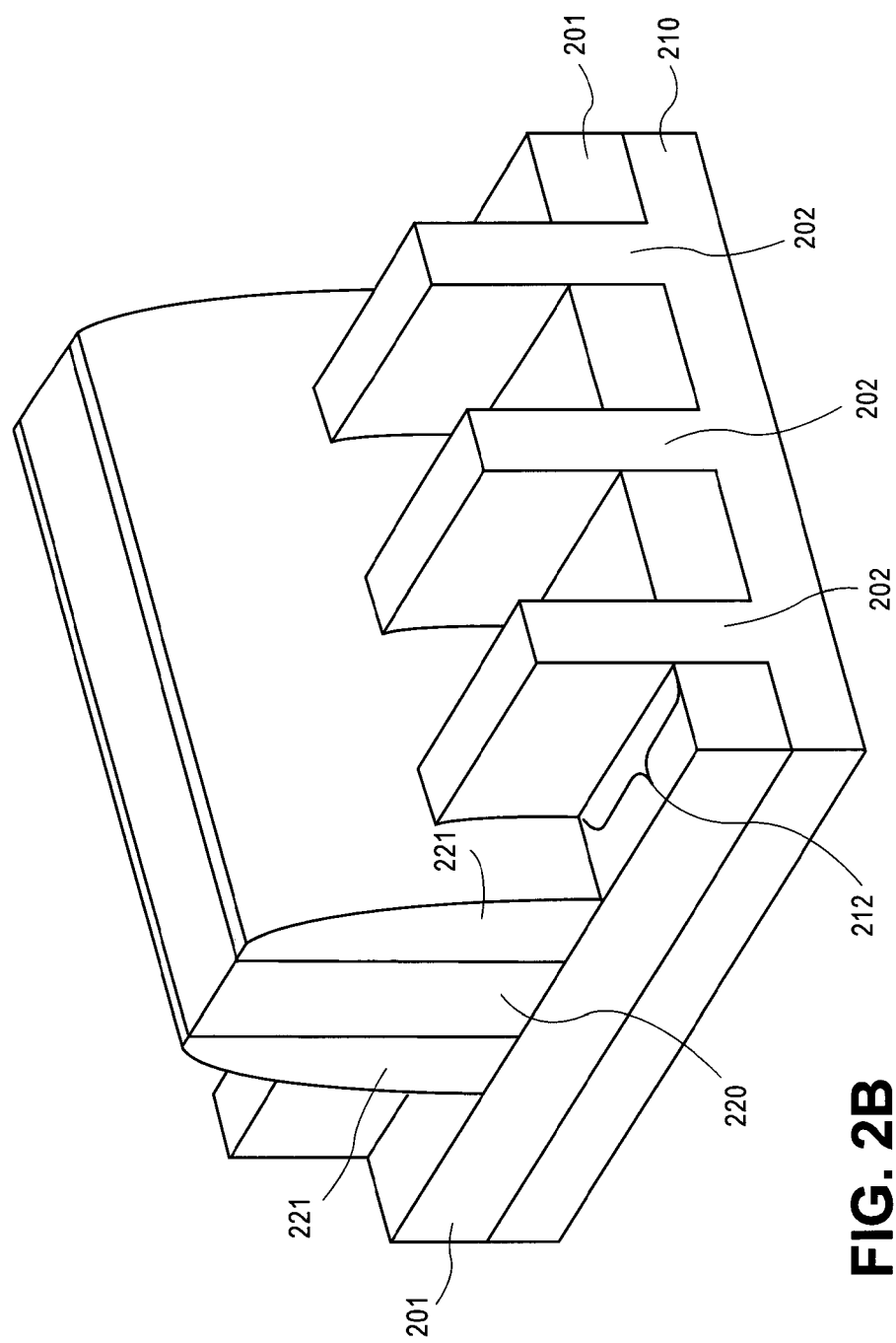
Figure 2C:
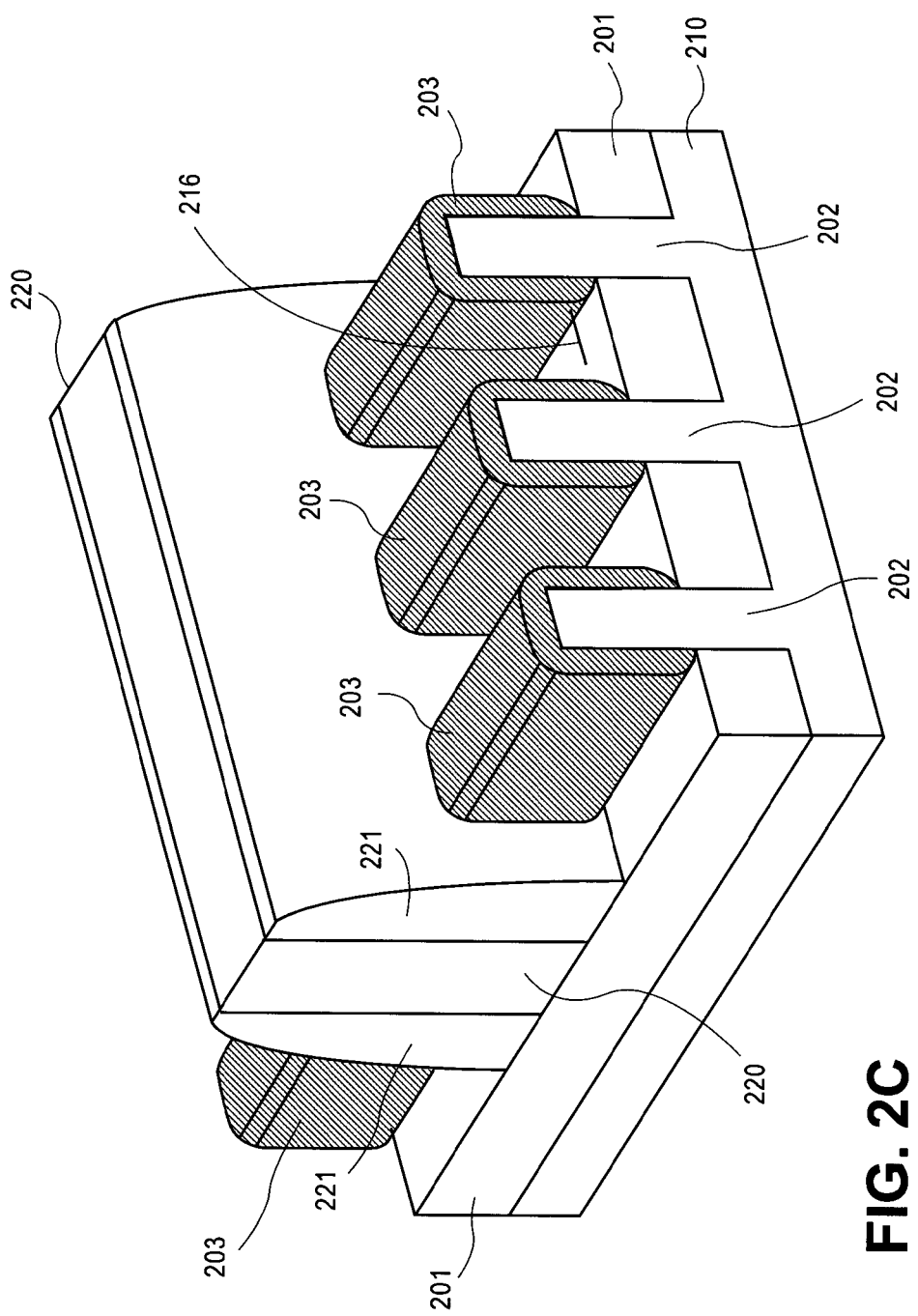
Figure 2D:
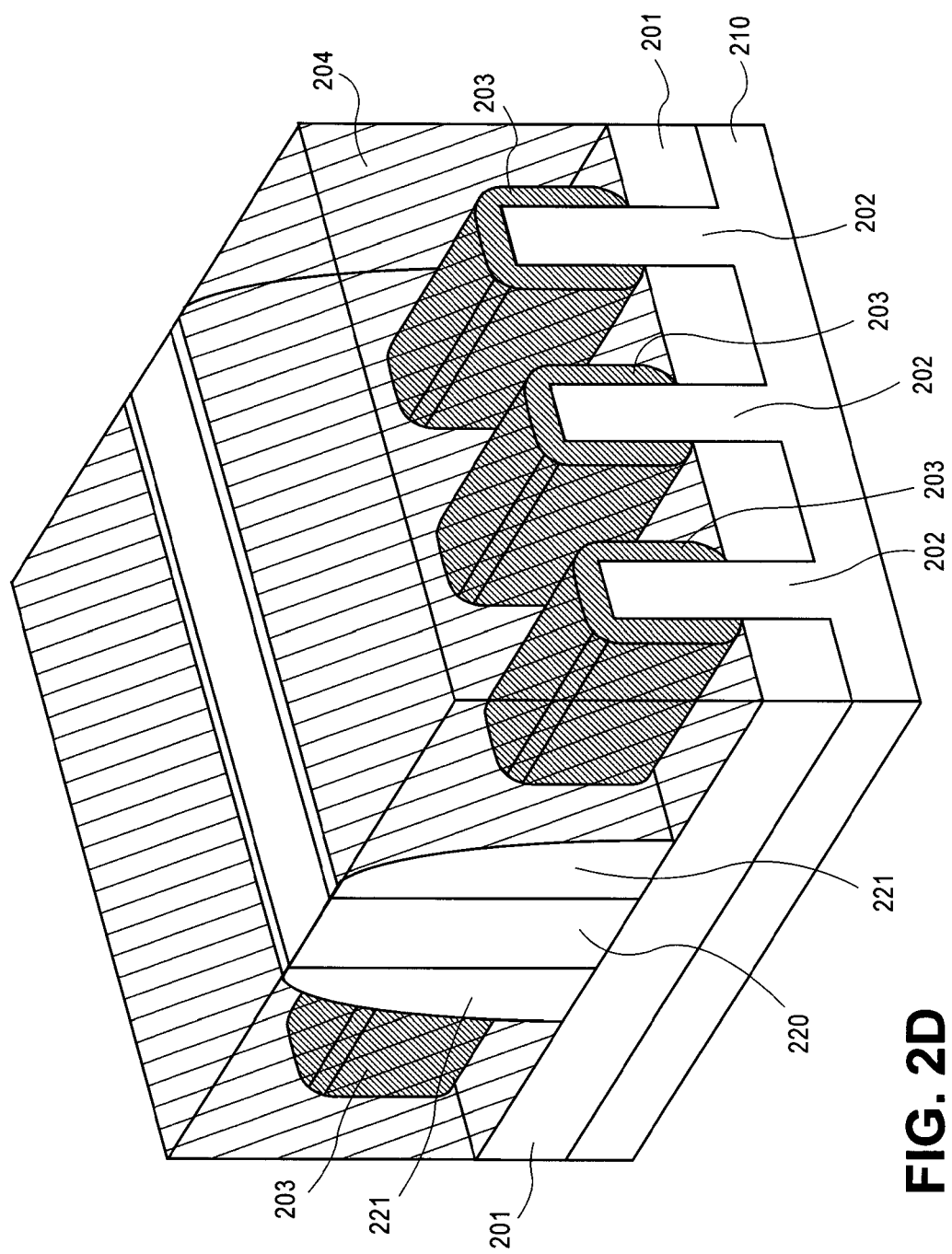
Figure 2E:
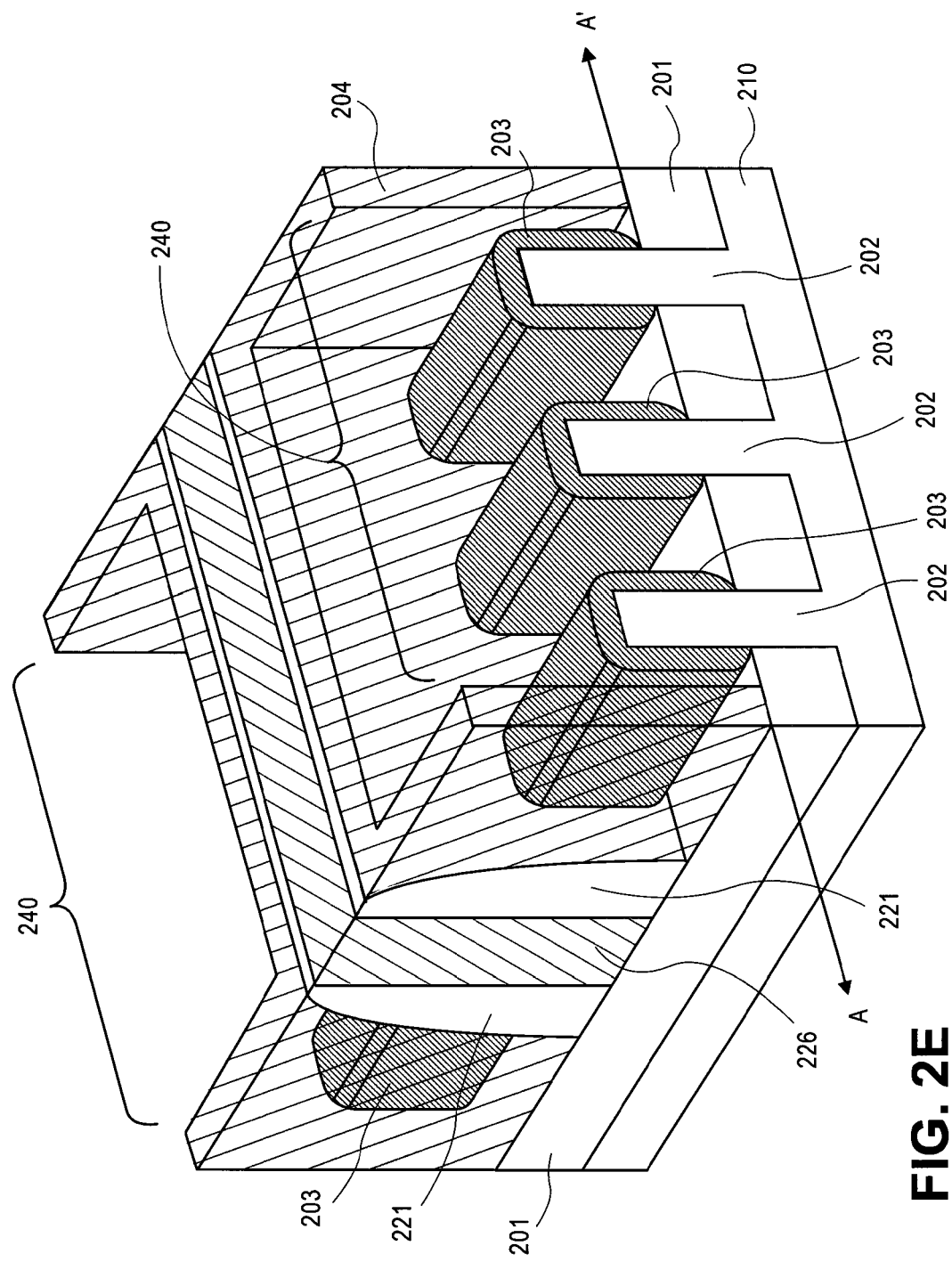
Figure 2F:
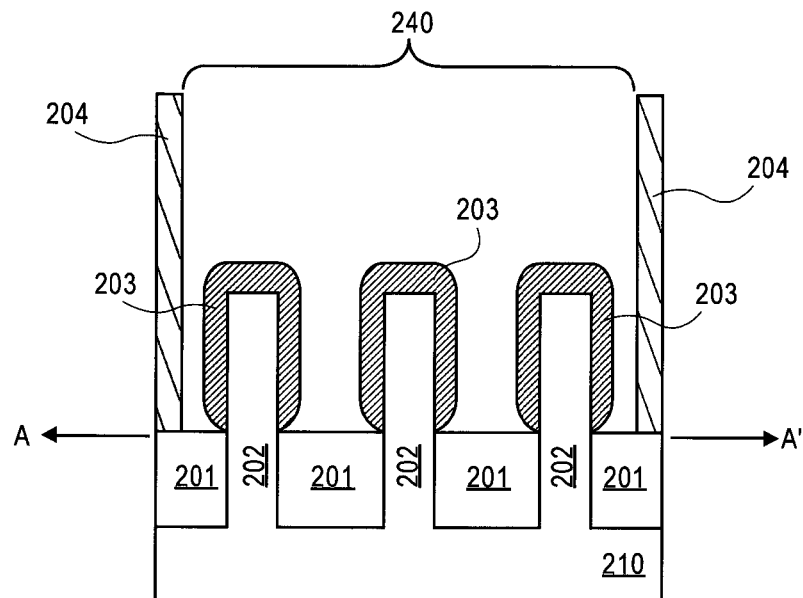
FIGS. 2F-2H illustrate a cross-sectional view of a process for forming wrap-around contacts on the source/drain regions of a multi-fin semiconductor device, according to an embodiment of the invention.
Figure 2G:
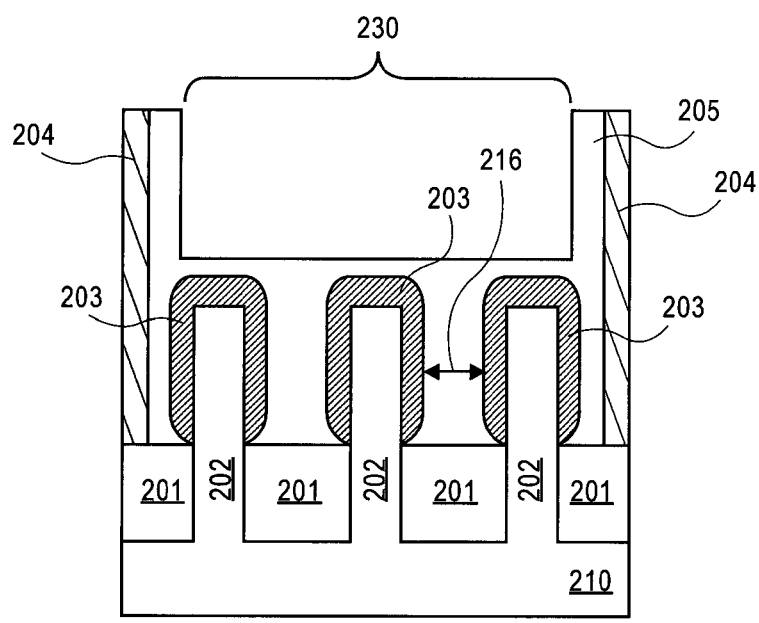
Figure 2H:
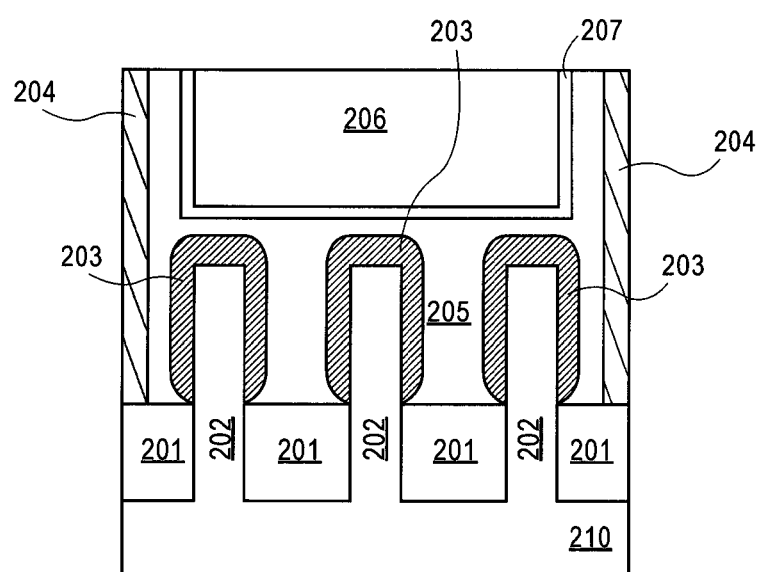

A method for forming wrap-around source/drain contacts on a fin-based semiconductor device, according to an embodiment of the invention, is illustrated by FIGS. 2A-H. FIGS. 2A-E show a three-dimensional perspective of the formation of transistor components including the gate stack and the source/drain regions. FIGS. 2F-H illustrate a cross-sectional view of the formation of a source/drain trench contact on the source/drain regions of the device.

A structure comprising a plurality of fins 202 extending from substrate 210 and a gate structure 220 wrapped around the fins to define a channel region 214 is provided, as shown in the embodiment illustrated by FIG. 2A. A pair of source/drain regions 212 are disposed in each fin 202 on opposite sides of the channel region. Fins 202 have a high aspect ratio and are closely-spaced, in order to minimize the device footprint.

In an embodiment, fins 202 are formed from a bulk substrate 210, wherein fins 202 and substrate 210 are a monocrystalline material suitable for semiconductor device fabrication. In another embodiment, fins are fabricated from an SOI substrate. As discussed above, an SOI substrate comprises a lower bulk layer, a middle insulator layer, and a top monocrystalline layer. In an embodiment, fins 202 are formed from the top monocrystalline layer of an SOI substrate, and the middle insulator layer forms the isolation region at the base of the fins. Fins 202 may be silicon, germanium, silicon-germanium, hafnium nitride, or a group III-V compound semiconductor material. In a specific embodiment, fins 202 are silicon.

Isolation regions 201 are formed on the surface of substrate 210 between the bases of fins 202 to prevent leakage from the fins. Isolation regions 201 are composed of a material that may include, but is not limited to, low k dielectric materials such as silicon dioxide, silicon nitride or silicon oxynitride.

Gate structure 220 wraps around fins 202. Methods for forming gate structure 220 are known in the art. In an embodiment, gate structure 220 comprises a functional gate electrode and a gate dielectric. In another embodiment, gate structure 220 is a sacrificial gate electrode and sacrificial gate dielectric for a replacement gate process. Following the formation of gate structure 220, fins 202 may be doped, for example, by tip implantation or halo implantation, as is well-known in the art. In an embodiment, the tip and halo regions may be left as intrinsic semiconductor, such as intrinsic silicon.

Sidewall spacers 221 are formed on the sidewalls of gate structure 220 as illustrated by the embodiment shown in FIG. 2B. In an embodiment, sidewall spacers 221 isolate the gate from the epitaxial layer that will subsequently be formed on the source/drain regions of each fin. Sidewall spacers 221 may be composed of an insulative dielectric material such as, but not limited to, silicon dioxide, silicon oxy-nitride, silicon nitride, or silicon carbide. Sidewall spacers 221 may be formed by blanket deposition of a spacer layer followed by an anisotropic etching technique, where the spacer material is preserved on the gate sidewalls but removed from the fin surface. In an embodiment, an over-etch is used to remove spacer material from the sidewalls of fins 202 to enable subsequent growth of an epitaxial layer on the fin surfaces.

Next, in an embodiment, an epitaxial silicon layer 203 is formed on the top and side surfaces of the source/drain regions of fins 202 as shown in FIG. 2C. In an embodiment, epitaxial semiconductor layer 203 is the same material as fins 202, such as, but not limited to, silicon, germanium, or silicon-germanium. Epitaxial semiconductor layer 203 increases the surface area of fins 202 to enable a greater source/drain contact area. Epitaxial semiconductor layers are selectively formed on the semiconductor surfaces of the fins, but not on dielectric material surfaces. In an embodiment, adjacent epitaxial semiconductor layers 203 are distinct; that is, an epitaxial layer does not contact or merge with an adjacent epitaxial layer. The formation of epitaxial semiconductor layers 203 narrows the gap between adjacent fins 202 and extends the height of the fins, such that gaps 216 have a higher aspect ratio. Epitaxial semiconductor layers 203 are formed to a thickness sufficient to increase the surface area of the top and side surfaces of fins 202, so as to reduce current crowding in the fins. Epitaxial semiconductor layer 203 is 0-25 nm thick. In a specific embodiment, epitaxial semiconductor layer 203 is 10 nm thick. Any well known technique such as chemical vapor deposition (CVD) may be used to selectively grow the epitaxial layers. In another specific embodiment, no epitaxial semiconductor material is grown on fins 202.

Source/drain regions 212 may be doped or undoped. Heavy source/drain implants may be made into source/drain regions 212. In an embodiment, sacrificial gate structure 220 protects the channel region from the doping process, while spacers 221 offset the doping from the channel region, as is well known in the art. In a specific embodiment, source/drain regions 212 are n-type doped for an n-type device. In another specific embodiment, source/drain regions 212 are p-type doped for a p-type device. Doping may be done by ion implantation, using, for example, boron for p-type dopants or phosphorous for n-type dopants. In an embodiment, source/drain regions 212 are doped prior to the formation of epitaxial silicon layer 203. In another embodiment, epitaxial silicon layer 203 is doped in situ, during the epitaxial growth process.

Next, in an embodiment of the invention, dielectric layer 204 is blanket deposited over the structure. Dielectric layer 204 may be polished to expose gate structure 220 for a replacement gate process, as shown in FIG. 2D. Gate structure 220 may comprise a sacrificial gate dielectric and a sacrificial gate electrode. During a gate replacement process, all or a portion of gate structure 220 may be removed, leaving sidewall spacers 221. In an embodiment, both the sacrificial gate electrode material and the sacrificial gate dielectric are removed. In another embodiment, the sacrificial gate electrode material is removed, and the gate dielectric material is maintained to form the gate dielectric of the subsequently formed gate stack 226. Gate stack 226 may then be formed between sidewall spacers 221. Gate stack materials are well-known in the art and discussed above with respect to FIGS. 1A-B. An embodiment of gate stack 226 includes a gate electrode and a gate dielectric. The gate electrode may comprise a work-function-setting layer and a non-work function-setting fill material. The work function-setting layer may comprise a p-type, n-type, or mid-gap material. Gate stack 226 may be planarized, such as by chemical mechanical planarization (CMP), until the top surface of the gate stack is planar with the dielectric layer 204.

In an embodiment of the invention, dielectric 204 is then etched to form source/drain contact trench 240, as shown in FIG. 2E. Source/drain contact trench 240 extends down to isolation layer 201, exposing the epitaxial semiconductor layers 203 on multiple fins. In an embodiment where there is not epitaxial semiconductor layer, the surfaces of fins 202 are exposed. In a specific embodiment, the exposed fins comprise a single device. In another specific embodiment, the contact trench 240 exposes fins that correspond to separate devices in order to form a contact connecting the adjacent devices together. Dielectric 204 may be etched by any suitable process, such as a wet etch.

FIG. 2F illustrates a two-dimensional cross-sectional view of the structure shown in FIG. 2E, taken along line A-A'. Contact trench 240 exposes the epitaxial semiconductor layers 203 on fins 202, along with portions of isolation regions 201 and dielectric 204. Fins 202 extend from substrate 210. Epitaxial silicon layers 203 are separated by gap 216, which has a high aspect ratio, greater than 2.

Contact metal layer 205 is formed in contact trench 240, as shown in the embodiment illustrated by FIG. 2G. In a specific embodiment, contact metal 205 completely fills contact trench 240. In another embodiment, contact metal layer 205 has a uniform thickness and conforms to the surfaces of the epitaxial semiconductor layer 203, along with portions of isolation regions 201 and dielectric layer 204 that are exposed within contact trench 240. In an embodiment, contact metal layer 205 completely fills gaps 216 and fills above the top surface of the epitaxial semiconductor layer 203, so as to maximize contact area and establish a low-conductivity path to the base of fins 202. In an embodiment, there are no voids at the metal-semiconductor interface. Contact metal layer 205 comprises a material selected to minimize the barrier height with respect to epitaxial semiconductor layer 203, as discussed above with respect to FIGS. 1A-B. In an embodiment, the conformal nature of contact metal layer 205 is achieved through deposition by atomic layer deposition (ALD) or CVD.

In an embodiment, contact metal layer 205 forms plug trench 230 above fins 202, as shown in FIG. 2H. In another embodiment, plug trench 230 extends into the gaps 216 between fins 202. In an embodiment, plug trench 230 is lined with barrier layer 207 and filled with plug 206. Barrier layer 207 conforms to the surface of plug 206 to prevent the interdiffusion of contact metal layer 205 and plug 206. Barrier layer 207 may also improve the adhesion of plug 206 to contact metal layer 205. Barrier layer may also prevent chemical attack of contact metal layer 205 during the deposition of plug metal 206. In an embodiment, barrier layer 107 comprises titanium, titanium nitride, tantalum, tantalum nitride, hafnium, or lanthanum. The conformal deposition of barrier layer 207 in plug trench 230 is achieved by ALD or CVD. Plug 206 may comprise a material that has a lower resistance than the material forming contact metal layer 205. In an embodiment, plug 206 comprises tungsten, aluminum, copper, or a combination of these. In an embodiment, plug 206 is blanket deposited over the substrate, filling plug trench 230. Plug 206 may be deposited by any suitable method, such as, for example, by CVD.

Next, plug 206, barrier layer 207, and contact metal layer 205 are chemically mechanically planarized, according to an embodiment of the invention. In an embodiment, an interconnect is electrically coupled to the source/drain trench contact to form an integrated circuit. Thus, a wrap-around source/drain trench contact has been disclosed.

Figure 3:
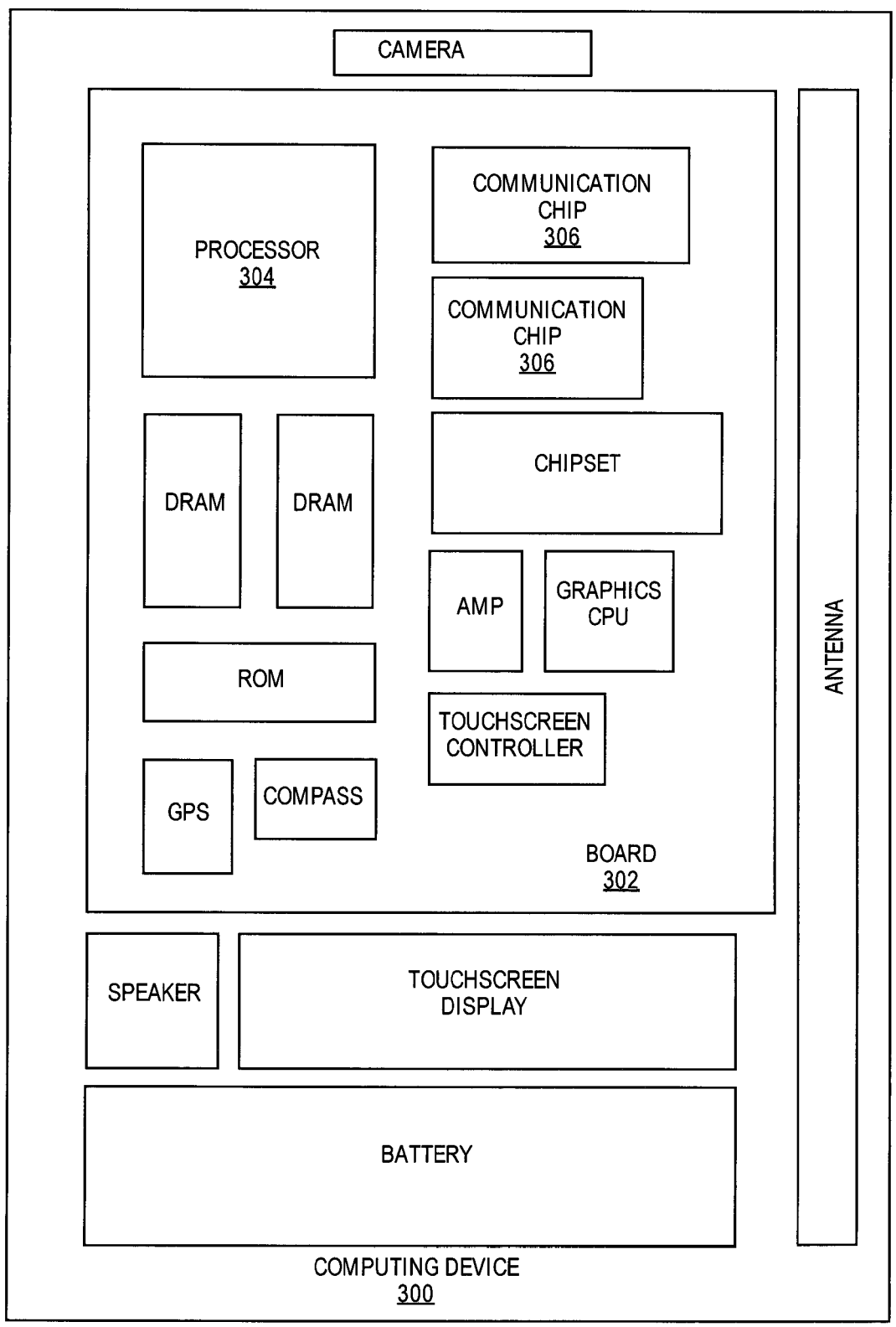
FIG. 3 illustrates a computing device in accordance with an embodiment of the invention.

FIG. 3 illustrates a computing device 300 in accordance with one implementation of the invention. The computing device 300 houses a board 302. The board 302 may include a number of components, including but not limited to a processor 304 and at least one communication chip 306. The processor 304 is physically and electrically coupled to the board 302. In some implementations the at least one communication chip 306 is also physically and electrically coupled to the board 302. In further implementations, the communication chip 306 is part of the processor 304.

Depending on its applications, computing device 300 may include other components that may or may not be physically and electrically coupled to the board 302. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 306 enables wireless communications for the transfer of data to and from the computing device 300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 306 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 300 may include a plurality of communication chips 306. For instance, a first communication chip 306 may be dedicated to shorter range wireless communications such as Wi-Fi and Bluetooth and a second communication chip 306 may be dedicated to longer range wireless communications such as GPS, EDGE, GPRS, CDMA, WiMAX, LTE, Ev-DO, and others.

The processor 304 of the computing device 300 includes an integrated circuit die packaged within the processor 304. In some implementations of the invention, the integrated circuit die of the processor includes one or more devices, such as airgap interconnects with hood layers, that are formed in accordance with implementations of the invention. The term "processor" may refer to any device or portion of a device that processes electronic data from registers and/or memory to transform that electronic data into other electronic data that may be stored in registers and/or memory.

The communication chip 306 also includes an integrated circuit die packaged within the communication chip 306. In accordance with another implementation of the invention, the integrated circuit die of the communication chip includes one or more devices, such as airgap interconnects with hood layers, that are formed in accordance with implementations of the invention.

In further implementations, another component housed within the computing device 300 may contain an integrated circuit die that includes one or more devices, such as airgap interconnects with hood layers, that are formed in accordance with implementations of the invention.

In various implementations, the computing device 300 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 300 may be any other electronic device that processes data.

What is claimed is:

1. An integrated circuit structure, comprising:
a semiconductor substrate having a first semiconductor fin and a second semiconductor fin protruding therefrom;
a trench isolation layer on the semiconductor substrate around a lower portion of the first semiconductor fin and around a lower portion of the second semiconductor fin, wherein an upper portion of the first semiconductor fin and an upper portion of the second semiconductor fin extend above the trench isolation layer;
a gate structure over the upper portion of the first semiconductor fin and over the upper portion of the second semiconductor fin, the gate structure having a first side and a second side;
a first epitaxial layer on the upper portion of the first semiconductor fin at the first side of the gate structure;
a second epitaxial layer on the upper portion of the second semiconductor fin at the first side of the gate structure, the second epitaxial layer discontinuous from the first epitaxial layer, wherein there is no silicide between the first epitaxial layer and the second epitaxial layer;
a contact metal over the first epitaxial layer and over the second epitaxial layer, the contact metal between the first and second epitaxial layers, the contact metal on a first portion of the trench isolation layer between the first epitaxial layer and the second epitaxial layer, and the contact metal having an uppermost surface, wherein the contact metal is not a silicide; and
a dielectric spacer between the contact metal and the gate structure, the dielectric spacer having an uppermost surface at a same level as the uppermost surface of the contact metal.

2. The integrated circuit structure of claim 1, wherein the contact metal is directly on the first epitaxial layer and directly on the second epitaxial layer.

3. The integrated circuit structure of claim 1, wherein the contact metal extends from the first portion of the trench isolation layer to a height above the first and second epitaxial layers, and wherein the contact metal completely fills a gap between the first epitaxial layer and the second epitaxial layer.

4. The integrated circuit structure of claim 1, wherein the first and second semiconductor fins comprise silicon, and wherein the first and second epitaxial layers comprise silicon and germanium.

5. The integrated circuit structure of claim 1, further comprising:
a third epitaxial layer on the upper portion of the first semiconductor fin at the second side of the gate structure;
a fourth epitaxial layer on the upper portion of the second semiconductor fin at the second side of the gate structure, the fourth epitaxial layer discontinuous from the third epitaxial layer; and
a second contact metal over the third epitaxial layer and over the fourth epitaxial layer, the second contact metal between the third and fourth epitaxial layers, and the second contact metal on a second portion of the trench isolation layer between the third epitaxial layer and the fourth epitaxial layer.

6. The integrated circuit structure of claim 5, wherein the second contact metal is directly on the third epitaxial layer and directly on the fourth epitaxial layer.

7. A method of fabricating an integrated circuit structure, the method comprising:
forming a first semiconductor fin and a second semiconductor fin protruding from a semiconductor substrate;
forming a trench isolation layer on the semiconductor substrate around a lower portion of the first semiconductor fin and around a lower portion of the second semiconductor fin, wherein an upper portion of the first semiconductor fin and an upper portion of the second semiconductor fin extend above the trench isolation layer;

forming a gate structure over the upper portion of the first semiconductor fin and over the upper portion of the second semiconductor fin, the gate structure having a first side and a second side;

forming a first epitaxial layer on the upper portion of the first semiconductor fin at the first side of the gate structure;

forming a second epitaxial layer on the upper portion of the second semiconductor fin at the first side of the gate structure, the second epitaxial layer discontinuous from the first epitaxial layer, wherein there is no silicide between the first epitaxial layer and the second epitaxial layer;

forming a contact metal over the first epitaxial layer and over the second epitaxial layer, the contact metal between the first and second epitaxial layers, the contact metal on a first portion of the trench isolation layer between the first epitaxial layer and the second epitaxial layer, and the contact metal having an uppermost surface, wherein the contact metal is not a silicide; and forming a dielectric spacer between the contact metal and the gate structure, the dielectric spacer having an uppermost surface at a same level as the uppermost surface of the contact metal.

8. The method of claim 7, wherein the contact metal is directly on the first epitaxial layer and directly on the second epitaxial layer.

9. The method of claim 7, wherein the contact metal extends from the first portion of the trench isolation layer to a height above the first and second epitaxial layers, and wherein the contact metal completely fills a gap between the first epitaxial layer and the second epitaxial layer.

10. The method of claim 7, wherein the first and second semiconductor fins comprise silicon, and wherein the first and second epitaxial layers comprise silicon and germanium.

11. The method of claim 7, further comprising:

forming a third epitaxial layer on the upper portion of the first semiconductor fin at the second side of the gate structure;

forming a fourth epitaxial layer on the upper portion of the second semiconductor fin at the second side of the gate structure, the fourth epitaxial layer discontinuous from the third epitaxial layer; and forming a second contact metal over the third epitaxial layer and over the fourth epitaxial layer, the second contact metal between the third and fourth epitaxial layers, and the second contact metal on a second portion of the trench isolation layer between the third epitaxial layer and the fourth epitaxial layer.

12. The method of claim 11, wherein the second contact metal is directly on the third epitaxial layer and directly on the fourth epitaxial layer.

13. A computing device, comprising:

a board; and a component coupled to the board, the component including an integrated circuit structure, comprising:

a semiconductor substrate having a first semiconductor fin and a second semiconductor fin protruding therefrom;

a trench isolation layer on the semiconductor substrate around a lower portion of the first semiconductor fin and around a lower portion of the second semiconductor fin, wherein an upper portion of the first semiconductor fin and an upper portion of the second semiconductor fin extend above the trench isolation layer;

a gate structure over the upper portion of the first semiconductor fin and over the upper portion of the second semiconductor fin, the gate structure having a first side and a second side;

a first epitaxial layer on the upper portion of the first semiconductor fin at the first side of the gate structure;

a second epitaxial layer on the upper portion of the second semiconductor fin at the first side of the gate structure, the second epitaxial layer discontinuous from the first epitaxial layer, wherein there is no silicide between the first epitaxial layer and the second epitaxial layer;

a contact metal over the first epitaxial layer and over the second epitaxial layer, the contact metal between the first and second epitaxial layers, the contact metal on a first portion of the trench isolation layer between the first epitaxial layer and the second epitaxial layer, and the contact metal having an uppermost surface, wherein the contact metal is not a silicide; and a dielectric spacer between the contact metal and the gate structure, the dielectric spacer having an uppermost surface at a same level as the uppermost surface of the contact metal.

14. The computing device of claim 13, further comprising:

a memory coupled to the board.

15. The computing device of claim 13, further comprising:

a communication chip coupled to the board.

16. The computing device of claim 13, further comprising:

a camera coupled to the board.

17. The computing device of claim 13, further comprising:

a battery coupled to the board.

18. The computing device of claim 13, further comprising:

an antenna coupled to the board.

19. The computing device of claim 13, wherein the component is a packaged integrated circuit die.

20. The computing device of claim 13, wherein the computing device is selected from the group consisting of a mobile phone, a laptop, a desk top computer, a server, and a set-top box.

* * * * *